United States Patent [19]

Maeda et al.

[11] Patent Number: 5,075,752
[45] Date of Patent: Dec. 24, 1991

[54] BI-CMOS SEMICONDUCTOR DEVICE HAVING MEMORY CELLS FORMED IN ISOLATED WELLS

[75] Inventors: Takeo Maeda, Tokyo; Syuso Fujii, Kawasaki, both of Japan

[73] Assignee: Kabushiki Kaisha Toshiba, Kawasaki, Japan

[21] Appl. No.: 480,762

[22] Filed: Feb. 16, 1990

[30] Foreign Application Priority Data

Feb. 20, 1989 [JP] Japan ................................. 1-39816

[51] Int. Cl.⁵ .............................................. H01L 27/02
[52] U.S. Cl. ...................................... 357/43; 357/42; 357/48
[58] Field of Search ..................... 357/42, 43, 48, 50

[56] References Cited
U.S. PATENT DOCUMENTS 4,327,368  4/1982  Uchida ................................ 357/42
4,862,240  8/1989  Watanabe et al. ............... 357/43 X
4,879,255  11/1989  Deguchi et al. ................. 357/43 X
4,887,142  12/1989  Bertotti et al. ..................... 357/43

OTHER PUBLICATIONS

U.S. Ser. No. 216,045 filed Jul. 7, 1988, abandoned.
U.S. Ser. No. 343,302 filed Apr. 26, 1989.

Primary Examiner—Rolf Hille
Assistant Examiner—R. Potter
Attorney, Agent, or Firm—Banner, Birch, McKie & Beckett

[57] ABSTRACT

A Bi-CMOS semiconductor device includes a P-type semiconductor substrate, an N-type buried layer formed in the semiconductor substrate, a P-type well region formed on the buried layer, and an N-channel MOS transistor formed in a first predetermined area of the well region. The Bi-CMOS semiconductor device further includes an N-type surrounding layer formed to surround the well region in cooperation with the buried layer. The surrounding layer electrically isolates the well region from the substrate and the other P-type well region.

23 Claims, 17 Drawing Sheets

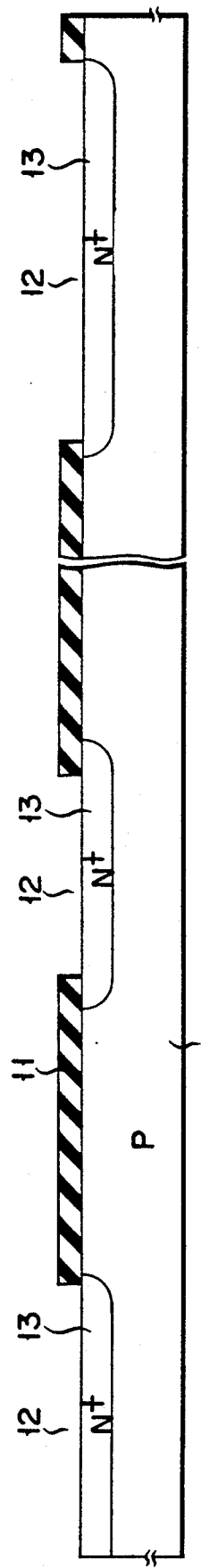
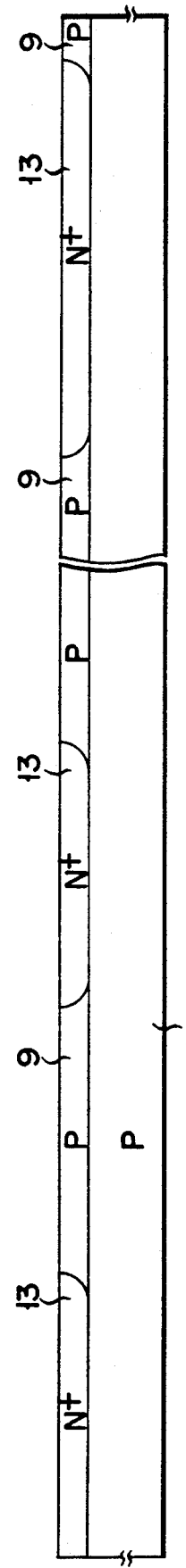
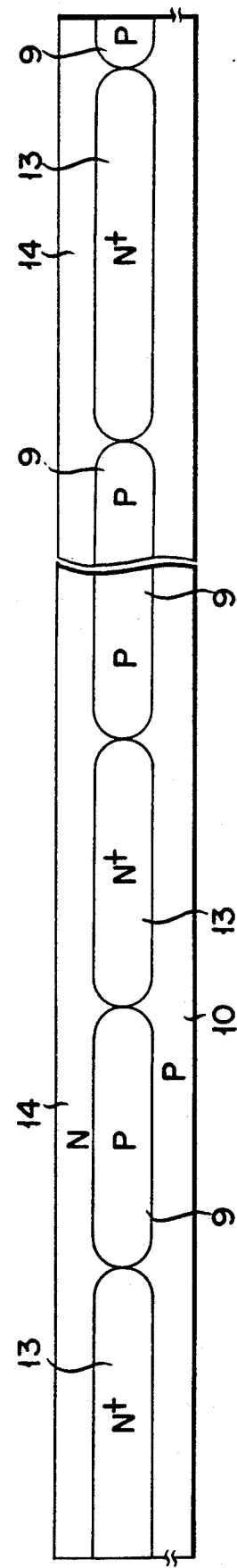
FIG. 1A
FIG. 1B
FIG. 1C

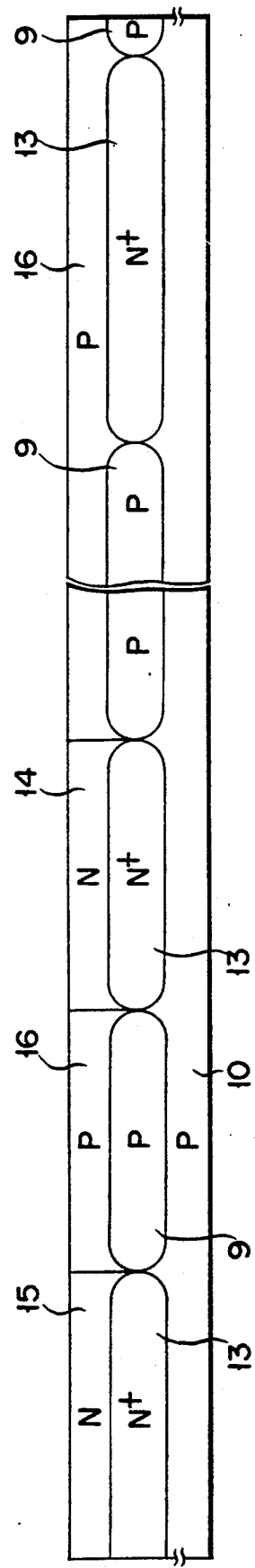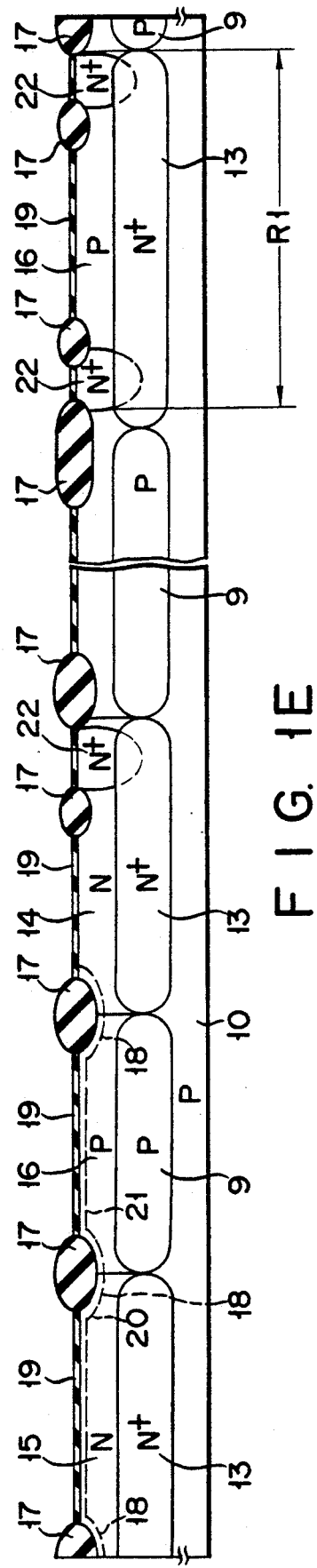
FIG. 1D
FIG. 1E

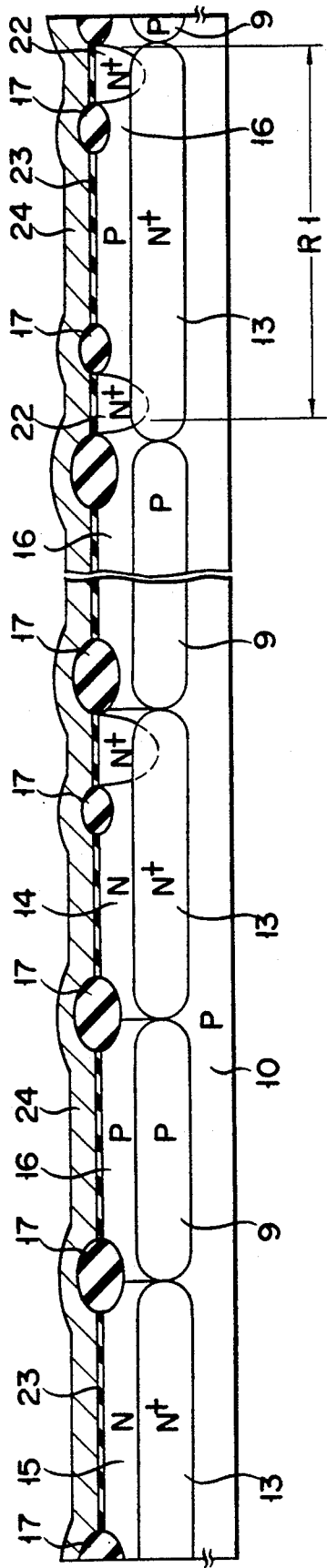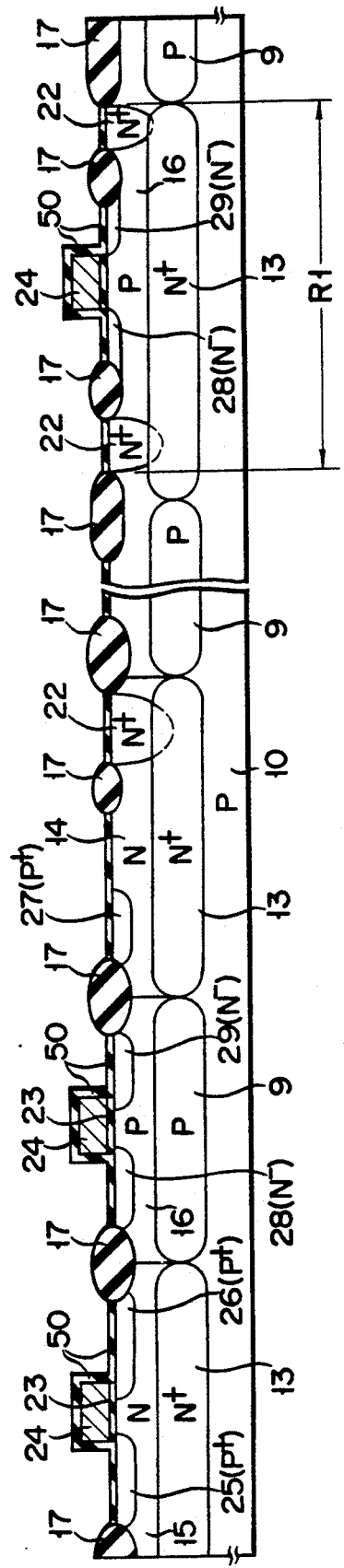
F I G. 1F
F I G. 1G

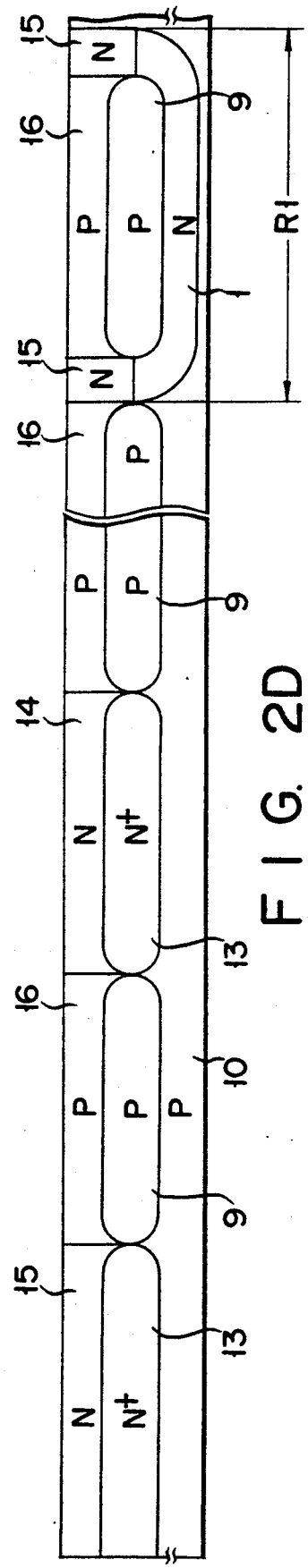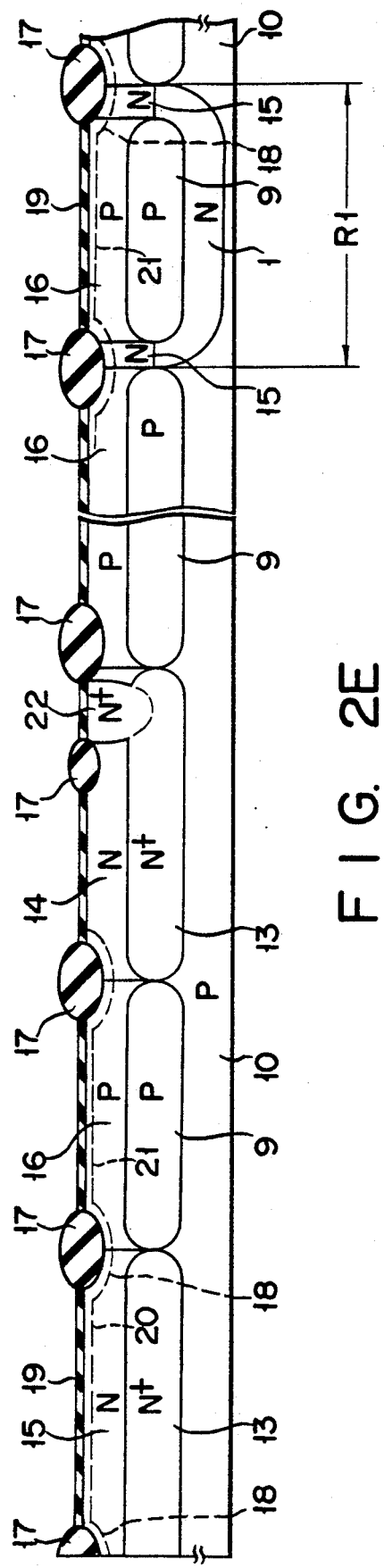
FIG. 2D
FIG. 2E

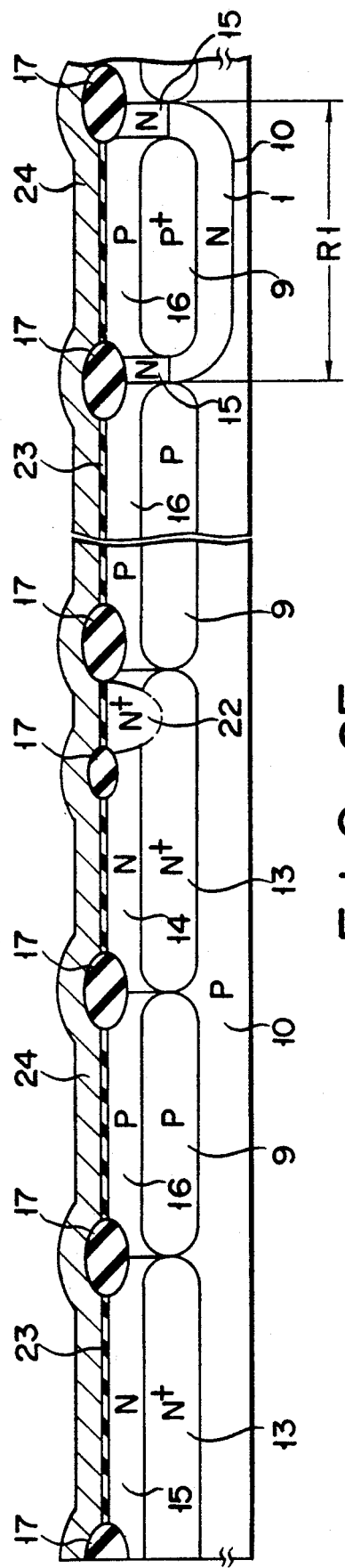
F I G. 2F
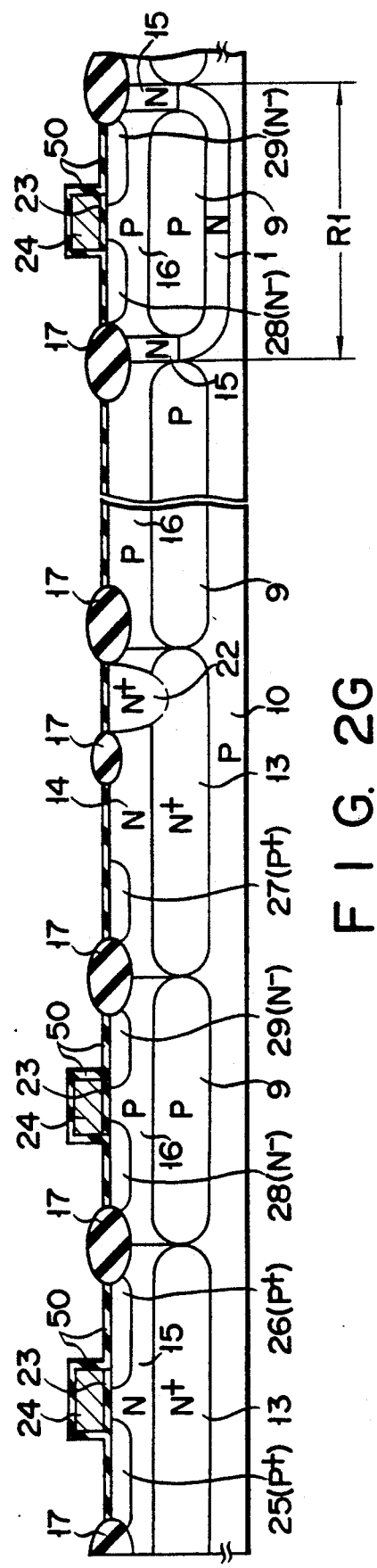
F I G. 2G

BI-CMOS SEMICONDUCTOR DEVICE HAVING MEMORY CELLS FORMED IN ISOLATED WELLS

BACKGROUND OF THE INVENTION

1. Field of the Invention

This invention relates to a Bi-CMOS semiconductor device having bipolar transistors and complementary MOS transistors formed on the same semiconductor substrate, and more particularly to a Bi-CMOS semiconductor device suitable for constituting a semiconductor memory device.

2. Description of the Related Art

Generally, in a Bi-CMOS semiconductor device, P-type wells and N-type wells are formed in a P-type semiconductor substrate, for example. In this case, N-channel MOS transistors are formed in the P-type well and P-channel MOS transistors are formed in the N-type well. Further, NPN bipolar transistors are formed in the N-type well.

In a case where an SRAM is constructed using the above Bi-CMOS semiconductor device, memory cells are generally formed of N-channel MOS transistors. In this case, since the N-channel MOS transistors are formed in the P-type well of the same conductivity type as the substrate (P), the N-channel MOS transistors are electrically connected to the P-type semiconductor substrate. For this reason, electrons in the P-type semiconductor substrate may tend to flow into the memory cells constructed by the N-channel MOS transistors. This may degrade the soft error-resistance of the memory cells.

Further, the potential of all the P-type wells is the same as that of the P-type substrate. Therefore, the potential of the P-type substrate is applied as the substrate bias voltage to the N-channel MOS transistors constituting the memory cells, as well as the other N-channel MOS transistors. As a result, it becomes impossible to apply different substrate bias voltages to the N-channel MOS transistors used as the memory cells and the other N-channel MOS transistors.

In general, the threshold voltage of the N-channel MOS transistors constituting the memory cells is preferably set to be slightly higher than that of the other N-channel MOS transistors in order to attain a good data holding characteristic. However, as described before, since the common substrate bias voltage is applied to all the N-channel MOS transistors in the conventional Bi-CMOS semiconductor device, the threshold voltage of the N-channel MOS transistors constituting the memory cells cannot be set higher than that of the other N-channel MOS transistors, making it impossible to attain a good data holding characteristic.

SUMMARY OF THE INVENTION

An object of this invention is to provide a Bi-CMOS semiconductor device having a structure suitable for realizing memory cells having a sufficiently high soft error-resistance and an excellent data holding characteristic.

According to this invention, there is provided a semiconductor device comprising a semiconductor substrate of a first conductivity type; a buried layer of a second conductivity type formed in the semiconductor substrate; a well region of the first conductivity type formed on the buried layer; a first MOS transistor of a second conductivity channel type formed in a predetermined area of the well region; and a surrounding layer of the second conductivity type formed to surround the first area of the well region in cooperation with the buried layer.

In the above semiconductor device, the well region is electrically isolated from the semiconductor substrate by means of the surrounding layer. Therefore, in a case where the first MOS transistor is used as a memory cell, occurrence of soft error in the memory cell can be suppressed. Further, since a specified bias voltage which is different from a potential of the substrate can be applied to the well region, it becomes possible to easily set the threshold voltage of the first MOS transistor to a value different from that of the other MOS transistors.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

Brief Description of the Drawings

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1J are cross-sectional views showing the process of manufacturing a Bi-CMOS semiconductor device according to a first embodiment of this invention;

FIGS. 2A to 2J are cross-sectional views showing the process of manufacturing a Bi-CMOS semiconductor device according to a second embodiment of this invention;

Detailed Description of the Preferred Embodiments

Figure 1H:
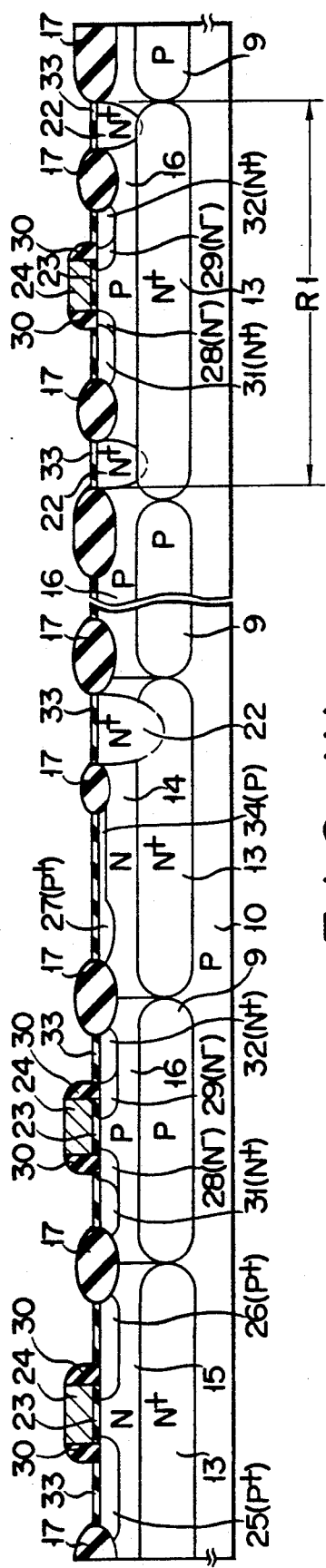

FIGS. 1A to 1J are sequential cross-sectional views showing various steps of the process of manufacturing a Bi-CMOS semiconductor device according to a first embodiment of this invention. Now, the structure of the Bi-CMOS semiconductor device of the first embodiment is explained in sequence, referring to the manufacturing steps shown in FIGS. 1A to 1J.

First, as shown in FIG. 1A, an insulation film 11 is formed on a P-type silicon semiconductor substrate 10 with (100) crystal plane, and then those portions of the insulation film 11 which correspond to areas for forming buried collector regions, N-channel MOS transistors constituting memory cells, and P-channel MOS transistors are removed by a photolithographic and etching process so as to form openings 12. Then, N+-type buried collector layers 13 are formed in those portions of the surface area of the substrate 10 which lie under the openings 12 by gas-phase or solid-phase diffusion of antimony (Sb), or ion-implantation of arsenic (As) or Sb.

Next, as shown in FIG. 1B, boron (B+) is ion-implanted into the entire surface of the wafer with an acceleration voltage of 100 KeV and a dose amount of $6 \times 10^{12}/cm^2$ after the insulation film 11 is entirely removed. Thus, buried P regions 9 with a low impurity concentration for punchthrough prevention are formed between the buried collector layers 13. After this, as shown in FIG. 1C, an N-type epitaxial layer 14, containing phosphorus of approx. $1 \times 10^{16}/cm^3$ as impurity is formed on the substrate 10 by epitaxial growth. The growth temperature set at this time is 1130° C. and the time of forming the N-type epitaxial layer 14, the thicknesses of the N+-type buried collector layer 13 and the buried P regions 9 of low impurity concentration become larger by outward diffusion.

Next, as shown in FIG. 1D, an ion-implantation mask (not shown) is formed by a photolithographic process, and then N well regions 15 are selectively formed using the mask by ion-implanting phosphorus (P) into the P-channel MOS transistor forming areas of the N-type epitaxial layer 14 with an acceleration energy of 160 KeV and a dose amount of $5 \times 10^{12}/cm^2$. Then, P well regions 16 are selectively formed using another ion-implantation mask (not shown) by ion-implanting boron (B) with an acceleration energy of 100 KeV and a dose amount of $6 \times 10^{12}/cm^2$. In the above steps, it is possible to form the P well regions 16 before the N well regions 15 are formed.

After this, as shown in FIG. 1E, a field oxide film 17 for isolating the MOS transistors from each other and isolating the MOS transistors from the bipolar transistors is formed by selective oxidation. The thickness of the field oxide film 17 is approx. 6000 Å. An ion-implantation region 18 for field inversion prevention is formed in a self-alignment manner before formation of the field oxide film 17.

Further, phosphorus is ion-implanted into the N-type epitaxial layer 14 and the P well region 16 of the memory cell forming area R1 with an acceleration energy of 320 KeV and a dose amount of $1 \times 10^{16}/cm^2$ so as to form deep N+ ion-implanted regions 22 in contact with the buried collector layers 13.

The deep N+ ion-implanted regions 22 formed in the N-type epitaxial layer 14 are used as collector lead-out electrodes of the NPN bipolar transistor. Further, the deep N+ ion-implanted regions 22 are formed in the P well region 16 of the memory cell formity area R1 so as to surround the P well region 16 and electrically isolate the P well region 16 of the memory cell forming area R1 from the external P well and the P type substrate 10 in cooperation with the buried collector layer 13.

Then, a dummy gate oxide film 19 with a film thickness of approx. 150 Å is formed on the entire surface by thermal oxidation. After this, a channel ion-implantation region 20 for controlling the threshold voltage of the P-channel MOS transistor and preventing the punchthrough thereof is formed in the surface area of the N well region 15 by ion-implantation through the dummy gate oxide film 19.

Likewise, a channel ion-implantation region 21 for controlling the threshold voltage of the N-channel MOS transistor and preventing the punchthrough thereof is formed in the surface area of the P well region 16. In this case, it is preferable to form the channel ion-implantation region 20 by ion-implanting boron (B) ions with an acceleration energy of 20 KeV and a dose amount of $3 \times 10^{12}/cm^2$, and ion-implanting phosphorus (P) ions with an acceleration energy of 240 KeV and a dose amount of $2 \times 10^{12}/cm^2$. Further, it is preferable to form the channel ion-implantation region 21 by ion-implanting boron (B) ions with an acceleration energy of 20 KeV and a dose amount of $4 \times 10^{12}/cm^2$.

Next, as shown in FIG. 1F, a gate oxide film 23 with a thickness of 150 Å is formed on the entire surface by thermal oxidation after the dummy gate oxide film 19 is removed. Then, a polysilicon layer 24 is formed on the gate oxide film 23 to a thickness of approx. 4000 Å by a chemical vapor deposition method (CVD method). After this, an impurity is doped into the polysilicon layer 24 by phosphorus (P) diffusion to lower the resistance of the polysilicon layer 24.

Next, as shown in FIG. 1G, the polysilicon layer 24 and the gate oxide film 23 are patterned by use of the photolithographic process to respectively form the gate electrodes of the P- and N-channel MOS transistors over the N well region 15 and P well regions 16. After this, an oxidation process is effected for 30 minutes at a temperature of 900° C. in an atmosphere of $O_2$ to form an oxide film 50 which covers the patterned polysilicon layers (gate electrodes) 24. Then, a mask (not shown) formed by the photolithographic process, the field oxide film 17 and the gate electrodes are used as a mask to ion-implant $BF_2^+$ ions with an acceleration energy of 50 KeV and a dose amount of $5 \times 10^{15}/cm^2$ so as to form P+-type source and drain regions 25 and 26 in the surface area of the N well region 15 and at the same time form P+-type external base region 27 of the bipolar transistor in the surface area of the N-type epitaxial layer 14. After this, a mask (not shown) formed by the photolithographic process, the field oxide film 17 and the gate electrodes are used as a mask to ion-implant P+ ions with an acceleration energy of 60 KeV and a dose amount of $4 \times 10^{13}/cm^2$ so as to form N−-type source regions 28 and drain regions 29 in the surface area of the P well regions 16.

Next, as shown in FIG. 1H, a CVD-$SiO_2$ film 30 is formed to a thickness of 2000 Å on the entire surface of the resultant structure and is selectively etched by an anisotropic etching technique such as a reactive ion etching process (RIE process) so that the CVD-$SiO_2$ film 30 can be left behind only on the side surfaces of the gate electrodes. Then, a mask (not shown) is formed with only the P well regions 16 and arsenic (As) ions are ion-implanted with an acceleration energy of 50 KeV and a dose amount of $5 \times 10^{15}/cm^2$ so as to form N+-type source regions 31 and drain regions 32 in the surface area of the P well regions 16. That is, N-channel MOS transistors with a so-called lightly doped drain (LDD) structure are formed in the P well regions 16. After this, an oxidation process is effected for 30 minutes at a temperature of 900° C. in an $O_2$ atmosphere to form an oxide film 33. Further, after photoresist (not shown) is formed to cover the surface of the P well regions 16 and N well region 15, $BF_2^+$ ions are ion-implanted with an acceleration energy of 30 KeV and a dose amount of $5 \times 10^{13}/cm^2$ so as to form a P+-type internal base region 34 in the N-type epitaxial layer 14.

Figure 1I:
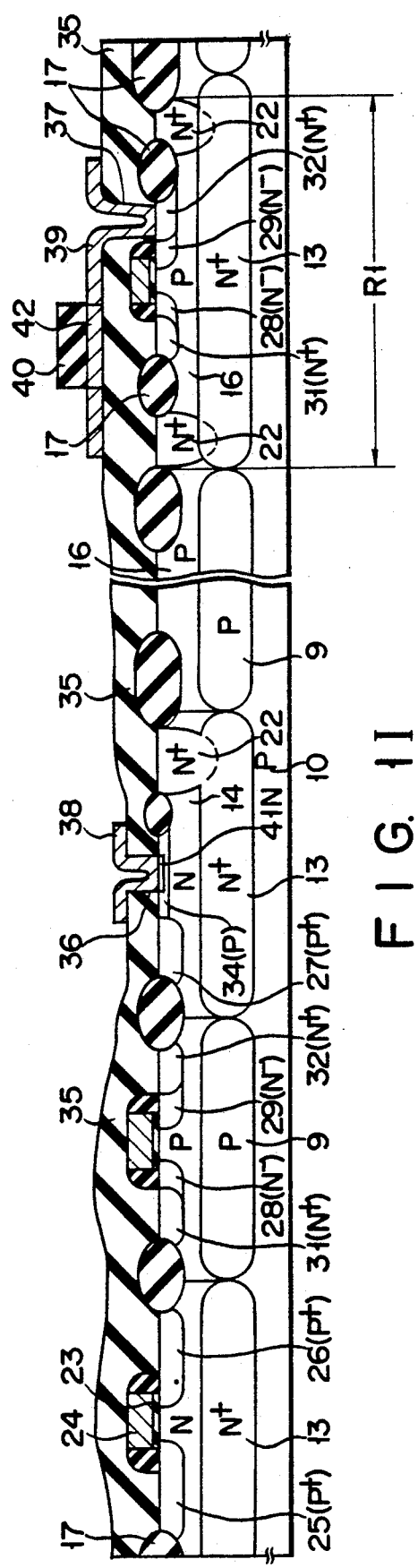

Next, as shown in FIG. 1I, a CVD-$SiO_2$ film 35 is formed as an interlayer insulation film to a thickness of 2000 Å on the entire surface of the resultant structure and a contact hole 36, which exposes part of the surface of the internal base region 34, and a contact hole 37, which exposes part of the surface of the N+-type drain region 32 of the N-channel MOS transistor in the memory cell forming area R1, are formed in the CVD-SiO$_2$ film 35. After this, a polysilicon layer is deposited to a thickness of 2000 Å and then patterned to form polysilicon layers 38 and 39, functioning as emitter electrodes and high resistance elements. At this time, it is preferable to set the deposition temperature of the polysilicon below 600° C. Subsequently, part of the polysilicon layer 39 is covered with a mask 40 of, for example, photoresist, then arsenic (As) ions are ion-implanted into the polysilicon layers 38 and 39 with an acceleration energy of 50 KeV and a dose amount of $5 \times 10^{15}/cm^2$, so as to form an N+-type emitter region 41 in the surface area of the internal base region 34 and at the same time form an emitter electrode by lowering the resistance of the polysilicon layer 38. Further, at this time, the resistance of part of the polysilicon layer 39 is lowered to form a high-resistance element 42 and a drain wiring of the N-channel MOS transistor. After the ion-implantation process, a heat treatment is effected for 5 seconds to 1 minute at temperature of 950° to 1100° C. to effect a so-called rapid annealing process. As a result, good contact can be attained.

Figure 1J:
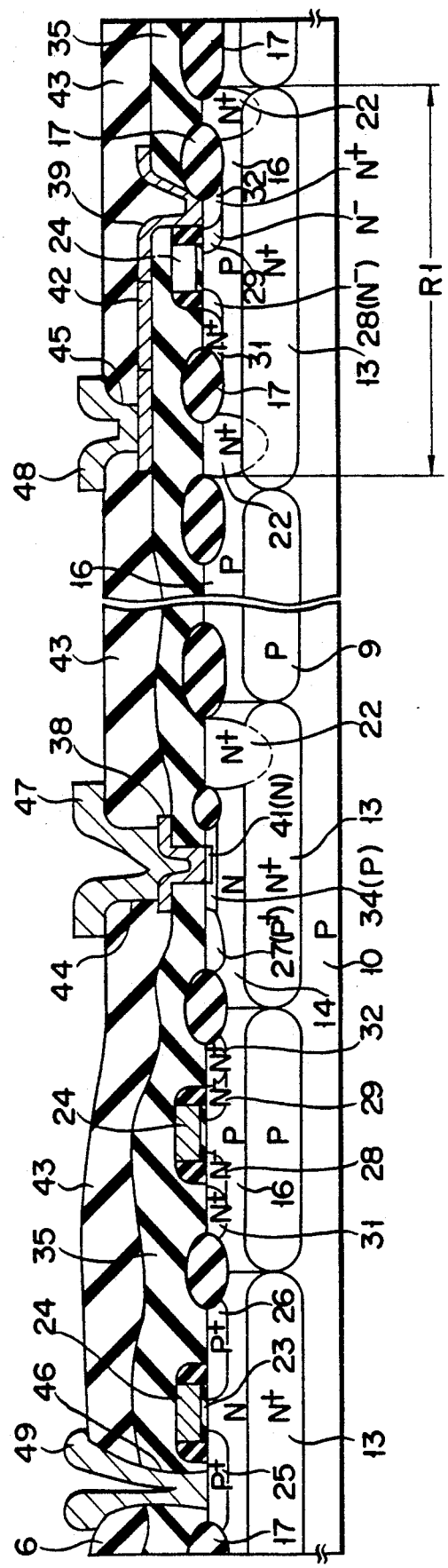

Next, as shown in FIG. 1J, an interlayer insulation film 43, formed with a laminated structure of a CVD-SiO$_2$ film and a BPSG film, is deposited on the entire surface of the resultant structure for surface planarization, and a contact hole 44, which exposes that part of the surface of the polysilicon layer 38 serving as the emitter electrode, and a contact hole 45, which exposes part of the surface of the polysilicon layer 39 serving as the drain wiring, are formed in the interlayer insulation film 43. At the same time, a contact hole 46, which exposes part of the surface of the source region 25 of the P-channel MOS transistor, is formed in the interlayer insulation film 43 and the underlying CVD-SiO$_2$ film 35. After this, a wiring aluminum layer is deposited on the entire surface of the resultant structure by a vacuum deposition process for example, and is patterned to form aluminum wirings 47, 48 and 49. Thus, the semiconductor device is completed.

In the structure of the first embodiment, the P well region 16 of the N-channel MOS transistor used as the memory cell is surrounded by the N+ region 13 and the deep N+ region 22, thereby electrically isolating the P well region 16 from the other well regions and the substrate 10. As a result, the soft error-resistance of the memory cell can be enhanced and a substrate bias voltage which is different from that applied to the other N-channel MOS transistors can be applied to the P well region 16.

Figure 1K:
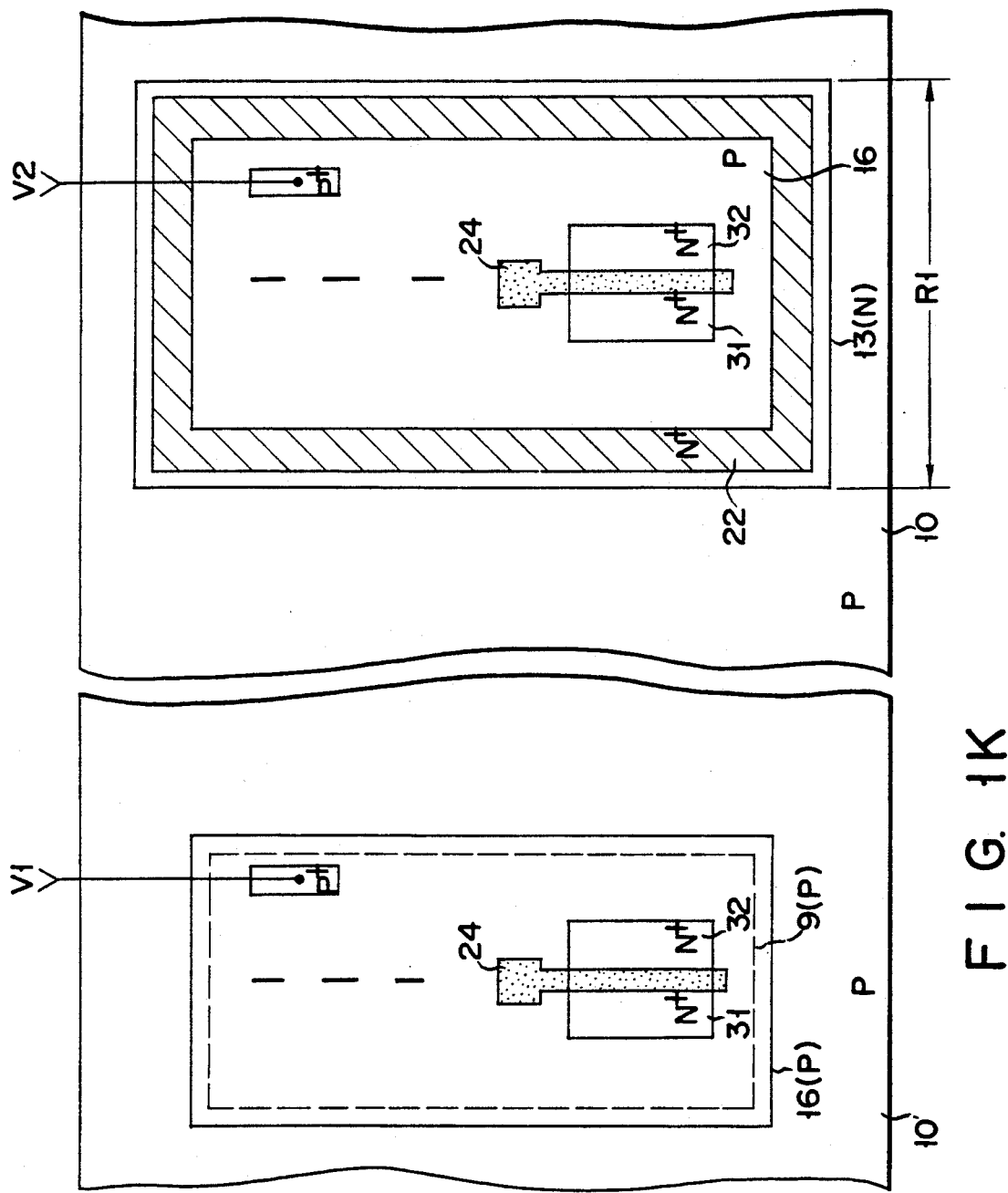
FIG. 1K is a view showing the plane pattern of the Bi-CMOS semiconductor device according to the first embodiment of this invention.

FIG. 1K schematically shows the plane pattern of the main portion of the Bi-CMOS semiconductor device of the first embodiment. In the semiconductor device of FIG. 1K, a bias voltage V2 is applied to the P well region 16 of the N-channel MOS transistor formed in the area R1, and a bias voltage V1 is applied to the P well region 16 of the N-channel MOS transistor formed outside the area R1. The bias voltage V2 is set higher than the bias voltage V1. In this case, since the threshold voltage of the N-channel MOS transistor constituting the memory cell is set higher than that of the other N-channel MOS transistors, the memory cell can be formed to have a good data holding characteristic.

In the semiconductor device thus manufactured, the high resistance element 42 constituted by part of the polysilicon layer 39 can be used as the load resistance of the SRAM cell.

Further, in the first embodiment, the N-channel MOS transistor is formed with the LDD structure. However, the N-channel MOS transistor can be formed with not only the LDD structure but also another structure which can be selected according to the transistor size. Poly-Si, or polysilicon, can be used to form the side wall of the gate electrode used for forming the LDD structure. Further, P+ ion-implantation for forming the P-channel may be effected after N+ ions are implanted to form the N-channel.

In the first embodiment, the SRAM memory cell is surrounded by the deep N+ region 22 and the buried N+ region 13. However, it is not limited to the SRAM memory cell and the same effect can be attained when it is applied to DRAM, EPROM, E$^2$PROM, mask ROM and other memory cells.

Next, a Bi-CMOS semiconductor device according to a second embodiment is explained according to the sequence of the manufacturing steps, with reference to FIGS. 2A to 2J. First, an impurity such as phosphorus (P) for forming a buried well in a memory cell forming area R1 is selectively ion-implanted into a P-type silicon semiconductor substrate 10 with a crystal plane (100) and then the semiconductor structure is subjected to a diffusion process at a temperature of 1190° C. for 30 hours to form a buried N well 1. After this, an insulation film 11 is deposited on the entire surface of the resultant structure and only those portions of the insulation film 11 which lie on the buried collector region forming area and P-channel MOS transistor forming area are removed by the photolithographic process to form openings 12. Then, N+-type buried collector layers 13 are selectively formed in those portions of the surface area of the substrate 10 which lie under the openings 12 by gas-phase or solid-phase diffusion of antimony (Sb), or ion-implantation of arsenic (As) or Sb.

Figure 2A:
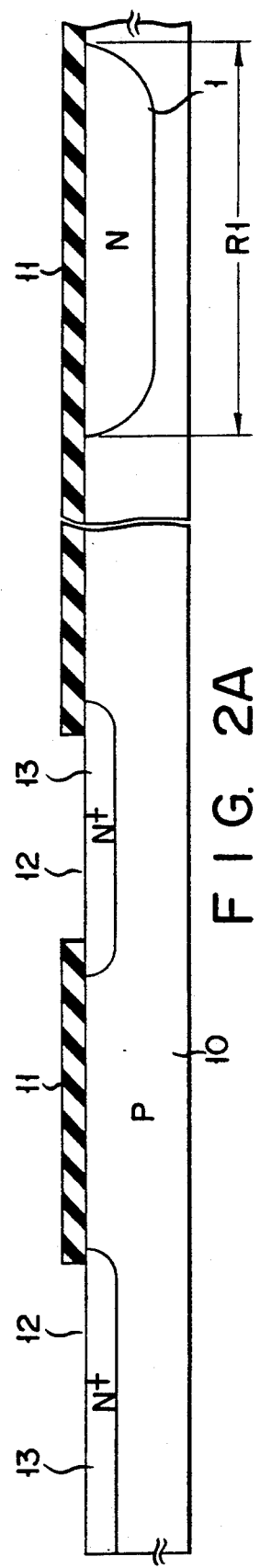
Figure 2B:
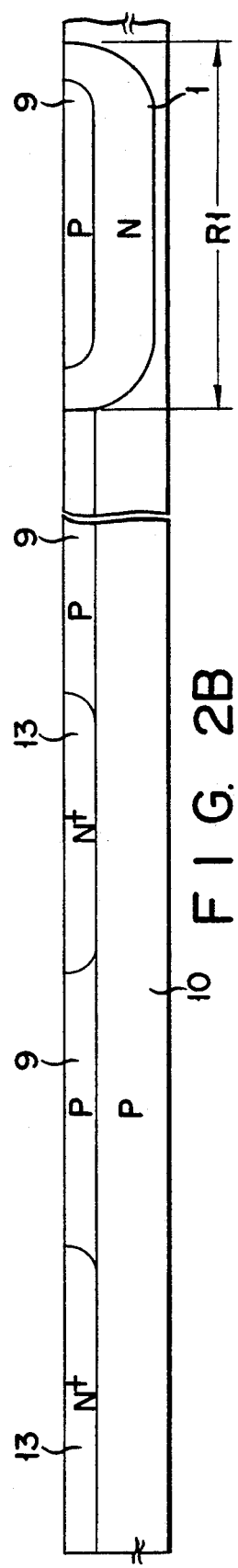
Figure 2C:
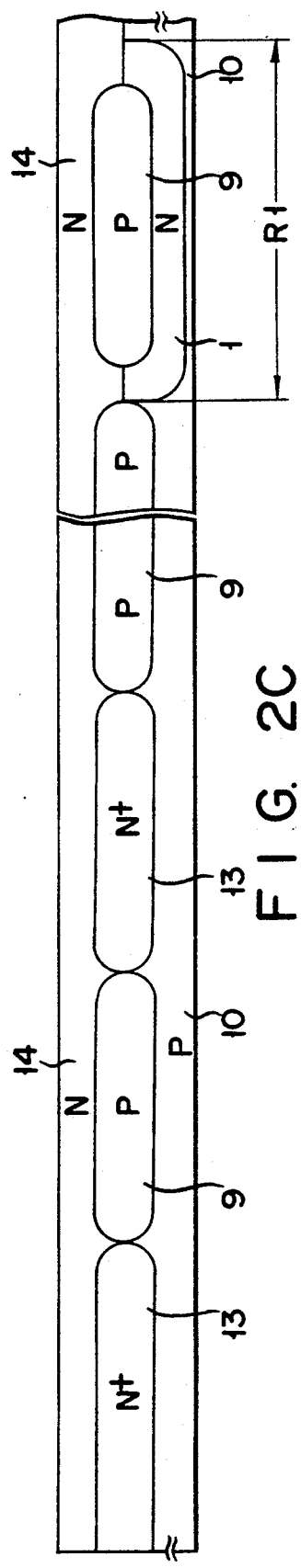

Next, as shown in FIG. 2B, boron (B+) ions are selectively ion-implanted into the entire surface of the wafer with an acceleration voltage of 100 KeV and a dose amount of $6 \times 10^{12}/cm^3$ after the insulation film 11 is entirely removed. Thus, first buried P regions 9 with a low impurity concentration for punchthrough prevention are formed. After this, as shown in FIG. 2C, an N-type epitaxial layer 14, containing phosphorus of approx. $1 \times 10^{16}/cm^3$ as an impurity, is formed on the substrate 10 by epitaxial growth. The growth temperature set at this time is 1130° C. and the thickness of the layer 14 is 1.2 μm, for example. At the time of forming the N-type epitaxial layer 14, the thicknesses of the N+-type buried collector layers 13 and the buried P regions 9, of low impurity concentration, become larger by outward diffusion.

Next, as shown in FIG. 2D, an ion-implantation mask (not shown) is formed by the photolithographic process, and then N well regions 15 are selectively formed using the mask by ion-implanting phosphorus (P) into the P-channel MOS transistor forming areas of the N-type epitaxial layer 14 with an acceleration energy of 160 KeV and a dose amount of $5 \times 10^{12}/cm^2$. Then, P well regions 16 are selectively formed using another ion-implantation mask (not shown) by ion-implanting boron (B) with an acceleration energy of 100 KeV and a dose amount of $6 \times 10^{12}/cm^2$.

At this time, the N well region 15 in the memory cell forming area R1 is formed to surround the buried P region 9 and P well region 16 in cooperation with the N well 1. In the above steps, it is possible to form the P well regions before the N well regions 15 are formed.

After this, as shown in FIG. 2E, a field oxide film 17 for isolating the MOS transistors from each other and isolating the MOS transistors from the bipolar transistors is formed by selective oxidation. The thickness of the field oxide film 17 is approx. 6000 Å. An ion-implantation region 18 for field inversion prevention is formed in a self-alignment manner prior to formation of the field oxide film 17.

Further, phosphorus (P) is ion-implanted into the N-type epitaxial layer 14 with an acceleration energy of 320 KeV and a dose amount of $1 \times 10^{16}/cm^2$ so as to form a deep N+ ion-implanted region 22 in contact with the buried collector layer 13.

Then, a dummy gate oxide film 19 with a film thickness of approx. 150 Å is formed on the entire surface of the resultant structure by thermal oxidation. After this, a channel ion-implantation region 20, for controlling the threshold voltage of the P-channel MOS transistor and preventing the punchthrough thereof, is formed in the surface area of the N well region 15 by ion-implantation through the dummy gate oxide film 19. Further, channel ion-implantation regions 21, for controlling the threshold voltage of the N-channel MOS transistors and preventing the punchthrough thereof, are formed in the surface area of the P well regions 16. In this case, the channel ion-implantation region 20 in the N well region 15 is formed by ion-implanting boron (B) ions with an acceleration energy of 20 KeV and a dose amount of $3 \times 10^{12}/cm^2$, and phosphorus (P) ions with an acceleration energy of 240 KeV and a dose amount of $2 \times 10^{12}/cm^2$. Further, the channel ion-implantation regions 21 in the P well regions 16 are formed by ion-implanting boron (B) ions with an acceleration energy of 20 KeV and a dose amount of $4 \times 10^{12}/cm^2$.

Next, as shown in FIG. 2F, an oxide film 23 with a thickness of approx. 150 Å is formed on the entire surface by thermal oxidation after the dummy gate oxide film 19 is removed. Then, a polysilicon layer 24 is formed on the gate oxide film 23 to a thickness of approx. 4000 Å by a chemical vapor deposition method (CVD method). After this, an impurity is doped into the polysilicon layer 24 by phosphorus (P) diffusion to lower the resistance of the polysilicon layer 24.

Next, as shown in FIG. 2G, the polysilicon layer 24 and the gate oxide film 23 are patterned by use of a photolithographic process to respectively form the gate electrodes of the P- and N-channel MOS transistors over the N well region 15 and P well regions 16. After this, an oxidation process is effected for 30 minutes at a temperature of 900° C. in an atmosphere of $O_2$ to form an oxide film 50 which covers the gate electrodes. Then, a mask (not shown) formed by the photolithographic process, the field oxide film 17 and the gate electrodes are used as masks while ion-implanting $BF_2$+ ions with an acceleration energy of 50 KeV and a dose amount of $5 \times 10^{15}/cm^2$ so as to form P+-type source and drain regions 25 and 26 in the surface area of the N well region 15. At this time, an external base region 27 of the bipolar transistor is formed by ion-implanting ion into the surface area of the N-type epitaxial layer 14 on the buried collector layer 13. After this, a mask (not shown) formed by the photolithographic process, the field oxide film 17 and the gate electrodes are again all used as masks to ion-implant P+ (phosphorus) ions with an acceleration energy of 60 KeV and a dose amount of $4 \times 10^{13}/cm^2$ so as to form N−-type source regions 28 and drain regions 29 in the surface area of the P well regions 16.

Figure 2H:
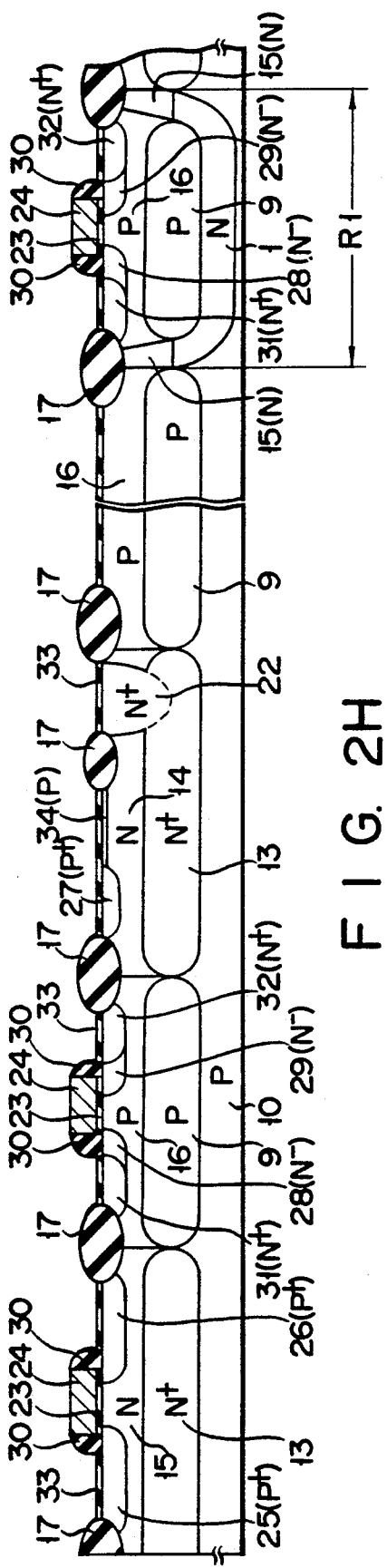

Next, as shown in FIG. 2H, a CVD-$SiO_2$ film 30 is formed to a thickness of 2000 Å on the entire surface of the resultant structure and is selectively etched by an anisotropic etching technique such as a reactive ion etching process (RIE process) so that the CVD-$SiO_2$ film 30 can be left behind only on the side surfaces of the gate electrodes. Then, a mask (not shown) is formed with only the P well regions 16 exposed and arsenic (As) ions are ion-implanted with an acceleration energy of 50 KeV and a dose amount of $5 \times 10^{15}/cm^2$ so as to form N+-type source regions 31 and drain regions 32 in the surface area of the P well regions 16. That is, N-channel MOS transistors with a so-called lightly doped drain (LDD) structure are formed in the P well regions 16. After this, an oxidation process is effected for 30 minutes at a temperature of 900° C. in an $O_2$ atmosphere to form an oxide film 33. Further, after photoresist (not shown) is formed to cover the surface of the P well regions 16 and N well regions 15, $BF_2$+ ions are ion-implanted with an acceleration energy of 30 KeV and a dose amount of $5 \times 10^{13}/cm^2$ so as to form a P-type internal base region 34 in the N-type epitaxial layer 14.

Figure 2I:
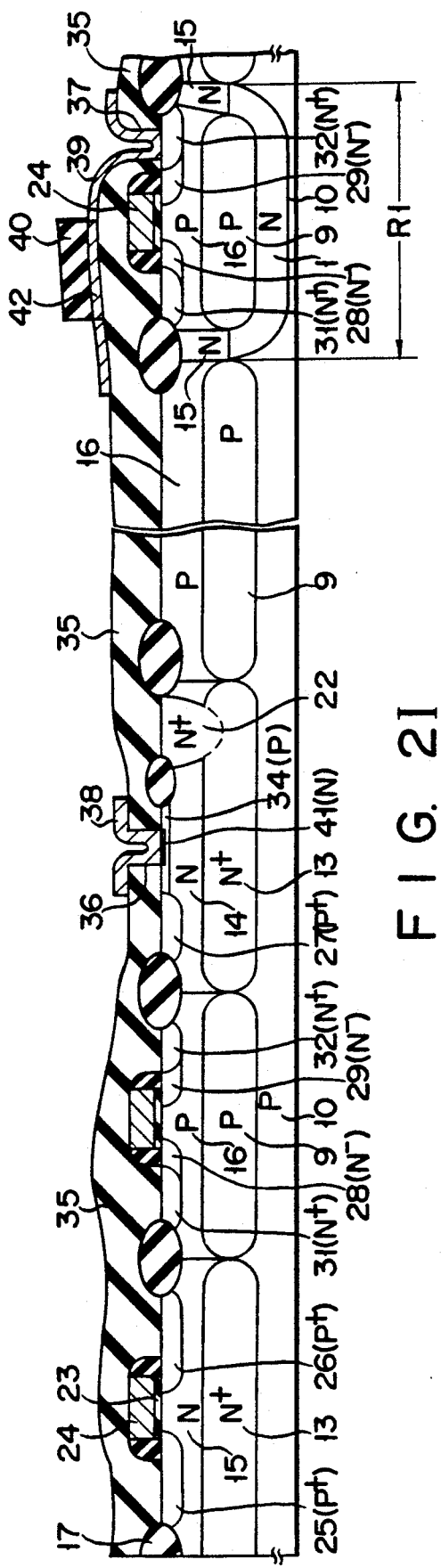

Next, as shown in FIG. 2I, a CVD-$SiO_2$ film 35 is formed as an interlayer insulation film to a thickness of 2000 Å on the entire surface of the resultant structure and a contact hole 36, which exposes part of the surface of the internal base region 34, and a contact hole 37, which exposes part of the surface of the N+-type drain region 32 of the N-channel MOS transistor in the memory cell forming area R1 are formed in the CVD-$SiO_2$ film 35. After this, a polysilicon layer is deposited to a thickness of 2000 Å and then patterned to form polysilicon layers 38 and 39 serving as emitter electrodes and high-resistance elements. At this time, it is preferable to set the deposition temperature of the polysilicon below 600° C. After this, part of the polysilicon layer 39 is covered with a mask 40 of photoresist, for example, and then As ions are ion-implanted into the polysilicon layers 38 and 39 with an acceleration energy of 50 KeV and a dose amount of $5 \times 10^{15}/cm^2$ so as to form an N+-type emitter region 41 in the surface area of the internal base region 34 and at the same time form an emitter electrode by lowering the resistance of the polysilicon layer 38. Further, at this time, the resistance of part of the polysilicon layer 39 is lowered to form a high-resistance element 42 and a drain wiring of the N-channel MOS transistor. After the ion-implantation process, a heat treatment is effected for 5 seconds to 1 minute at temperatures of 950° to 1100° C. to effect a so-called rapid annealing process. As a result, good contact can be attained.

Figure 2J:
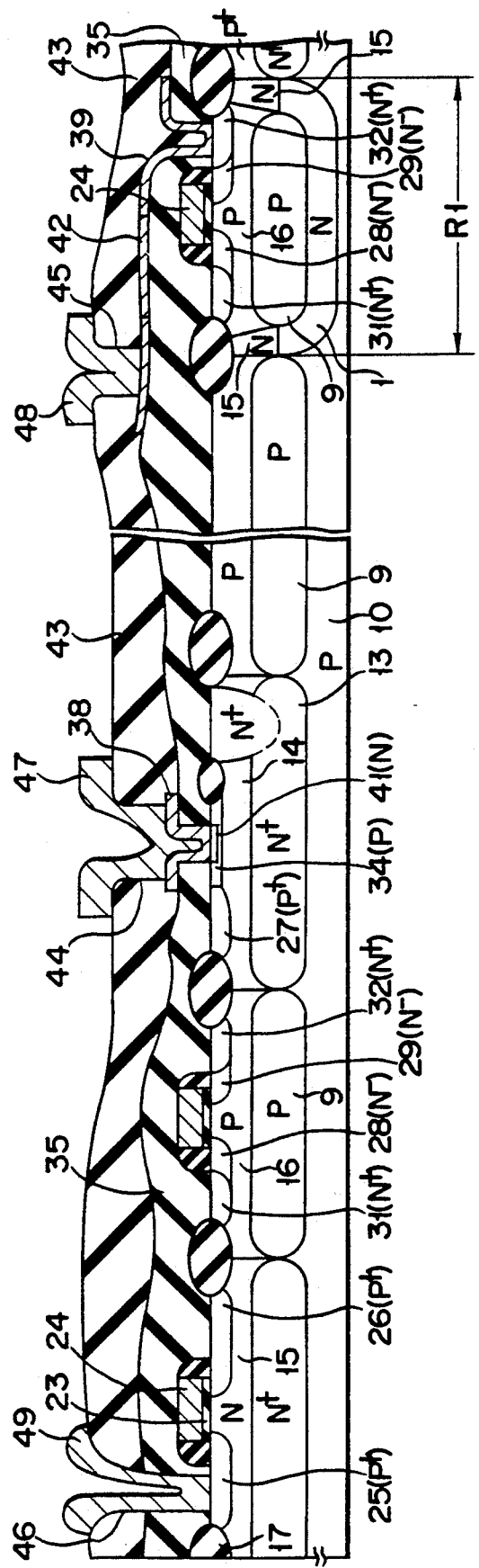

Next, as shown in FIG. 2J, an interlayer insulation film 43 formed of a CVD-$SiO_2$ film and a BPSG film is deposited on the entire surface of the resultant structure for surface planarization and then a contact hole 44, which exposes that part of the surface of the polysilicon layer 38 serving as the emitter electrode, and a contact hole 45, which exposes part of the surface of the polysilicon layer 39 serving as the drain wiring, are formed in the interlayer insulation film 43. At the same time, a contact hole 46 which exposes part of the surface of the source region 25 of the P-channel MOS transistor is formed in the interlayer insulation film 43 and the underlying CVD-SiO$_2$ film 35. After this, a wiring aluminum layer is deposited on the entire surface of the resultant structure by a vacuum deposition process, for example, and is patterned to form aluminum wirings 47, 48 and 49. Thus, the semiconductor device is completed.

In the structure of the second embodiment, the P well region 16 and the buried P well region 9 in the memory cell forming area R1 are surrounded by the buried N well 1 and the N well region 15, thereby electrically isolating the P well region 16 and the buried P well region 9 from the other well regions and the substrate 10. As a result, the soft error-resistance of the memory cell can be enhanced and a substrate bias voltage which is different from that applied to the other N-channel MOS transistors can be applied to the P well region 16 in the area R1.

Figure 2K:
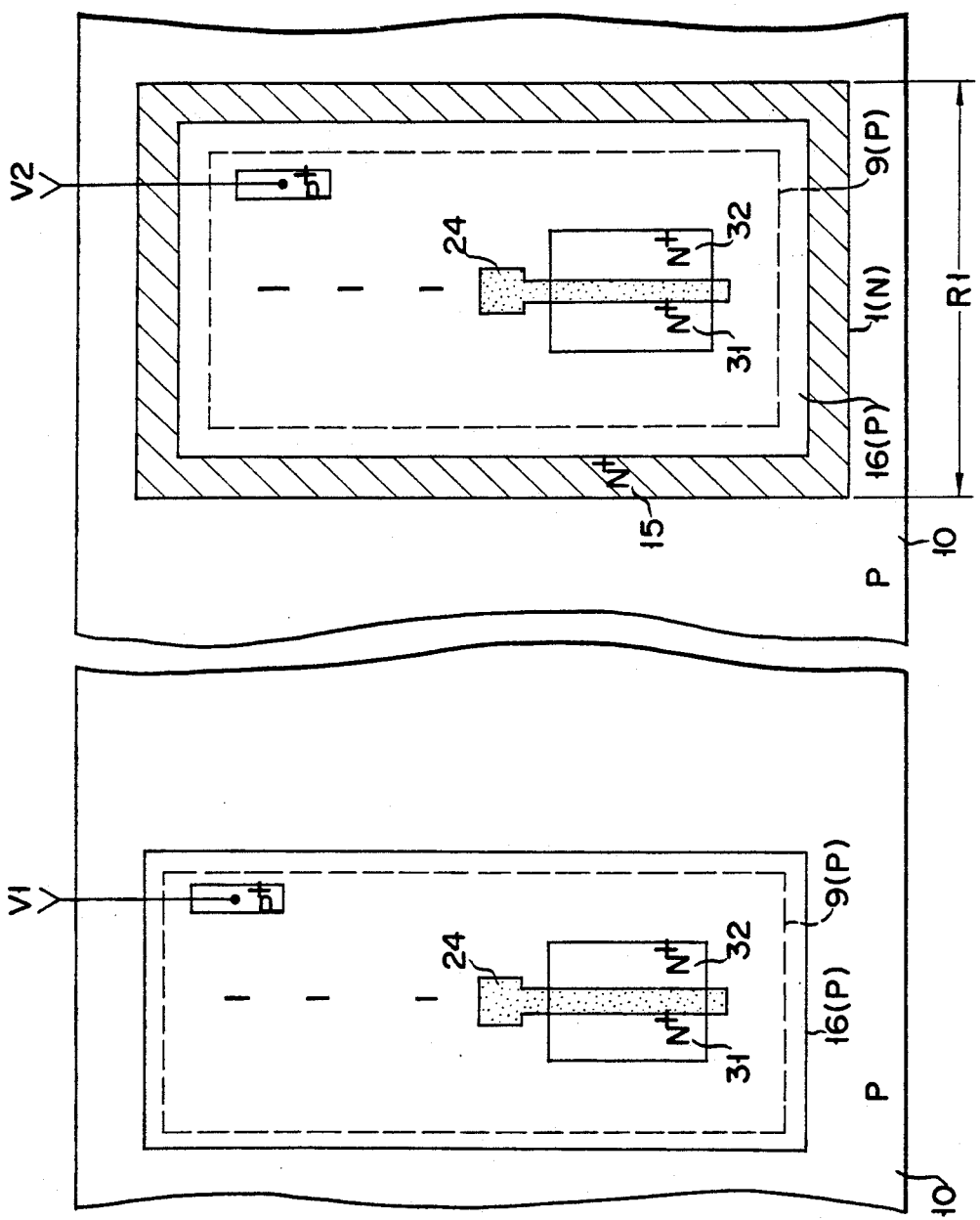
FIG. 2K is a view showing the plane pattern of the Bi-CMOS semiconductor device according to the second embodiment of this invention.

FIG. 2K schematically shows the plane pattern of the main portion of the Bi-CMOS semiconductor device of the second embodiment. In the semiconductor device of FIG. 2K, a bias voltage V2 is applied to the P well region 16 of the N-channel MOS transistor formed in the area R1 and a bias voltage V1 is applied to the P well region 16 of the N-channel MOS transistor formed outside the area R1. The bias voltage V2 is set higher than the bias voltage V1. In this case, since the threshold voltage of the N-channel MOS transistor constituting the memory cell is set higher than that of the other N-channel MOS transistors, the memory cell can be formed so as to have a good data holding characteristic.

Next, the structure of the Bi-CMOS semiconductor device of the third embodiment is explained according to the sequence of the manufacturing steps, with reference to FIGS. 3A to 3J.

Figure 3A:
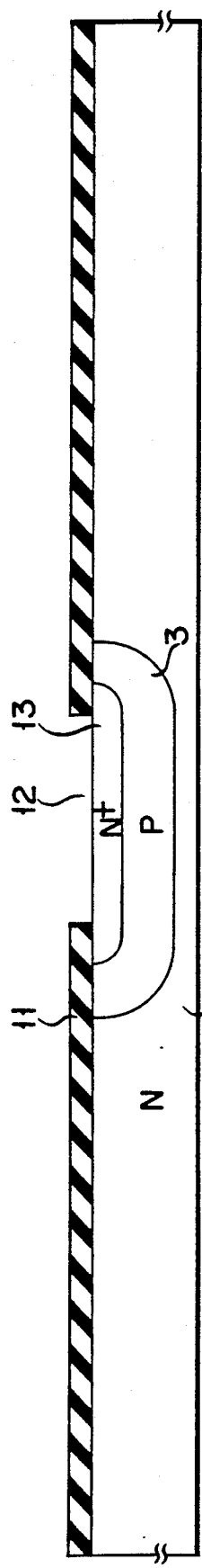
FIGS. 3A to 3J are cross-sectional views showing the process of manufacturing a Bi-CMOS semiconductor device according to a third embodiment of this invention.

First, as shown in FIG. 3A, boron (B) is selectively doped into that portion of an N-type silicon semiconductor substrate 10 with crystal plane (100) which lies in the NPN bipolar transistor forming area and diffused for 30 hours at a temperature of 1190° C. to form a buried P well 3. After this, an insulation film 11 is deposited on the resultant structure, then that portion of the insulation film 11 which corresponds to a buried collector region forming area is removed by a photolithographic process so as to form an opening 12. Then, an N$^+$-type buried collector layer 13 is formed by gas-phase or solid-phase diffusion of antimony (Sb), or ion-implantation of arsenic (As) or Sb.

Figure 3B:
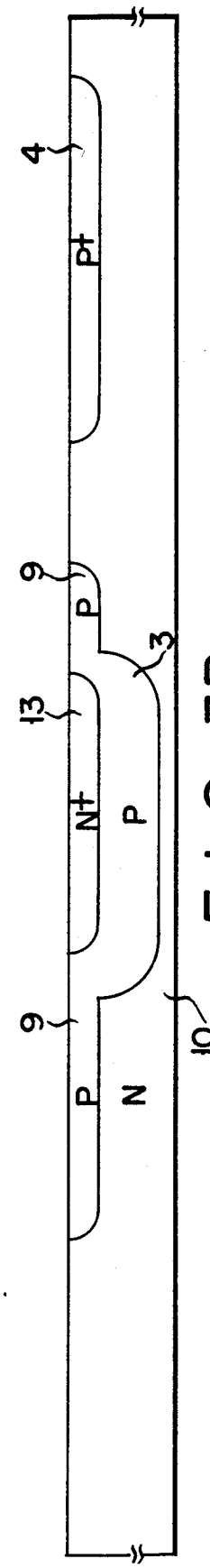

Next, as shown in FIG. 3B, boron (B$^+$) is selectively ion-implanted into the surface of the wafer with an acceleration voltage of 100 KeV and a dose amount of $6\times10^{12}$/cm$^2$ after the insulation film 11 is entirely removed. Thus, a buried P region 9 with a low impurity concentration is formed. As shown in FIG. 3B, the P region 9 is formed in contact with the P well 3, surrounding the buried collector layer 13.

Further, boron (B) is ion-implanted with an acceleration voltage of 20 KeV and a dose amount of $5\times10^{14}$/cm$^2$ so as to form a P$^+$ buried collector region 4 for a PNP transistor.

In this case, the buried P$^+$ region 4 can be formed at the same time as formation of the buried P region 9 with the same impurity concentration.

Figure 3C:
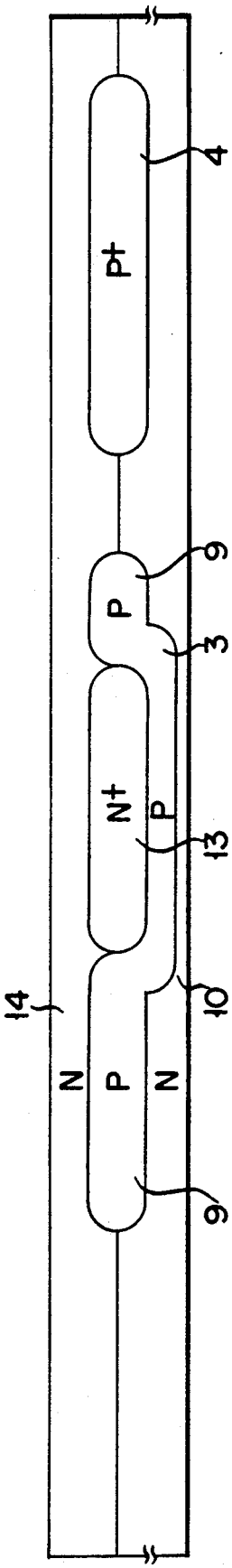
Figure 3D:
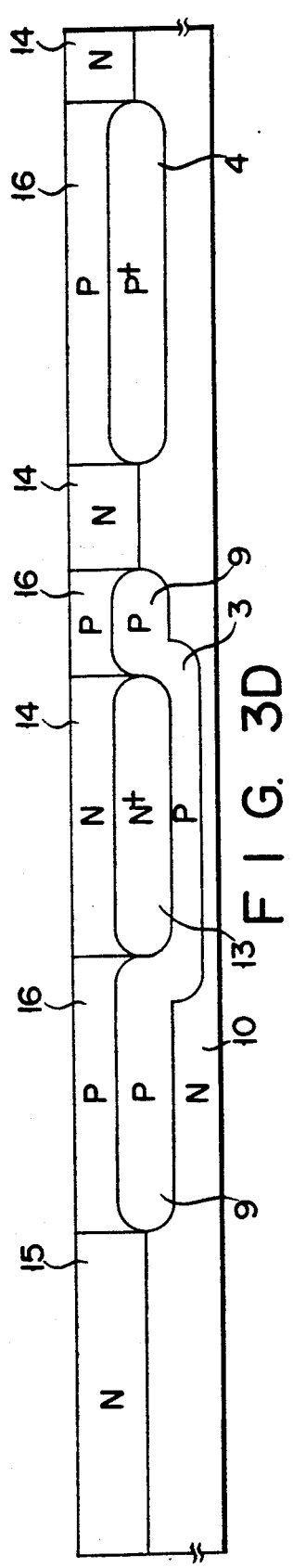

Next, as shown in FIG. 3C, an N-type epitaxial layer 14, containing phosphorus (P) of approx. $1\times10^{16}$/cm$^3$ as an impurity, is formed on the substrate 10 by epitaxial growth. The growth temperature set at this time is 1130° C. and the thickness of the layer 14 is 1.2 $\mu$m, for example. At the time of forming the N-type epitaxial layer 14, the thicknesses of the buried P region 9, buried collector layer 13 and buried P$^+$ region 4 become larger by outward diffusion. Next, as shown in FIG. 3D, an ion-implantation mask (not shown) is formed by the photolithographic process, and then N well regions 15 are selectively formed using the mask by ion-implanting phosphorus (P) into the P-channel MOS transistor forming areas of the N-type epitaxial layer 14 with an acceleration energy of 160 KeV and a dose amount of $5\times10^{12}$/cm$^2$. Then, P well regions 16 are selectively formed by use of another ion-implantation mask (not shown) by ion-implanting boron (B) with an acceleration energy of 100 KeV and a dose amount of $6\times10^{12}$/cm$^2$. In the above steps, it is possible to form the P well regions 16 and then form the N well regions 15.

Figure 3E:
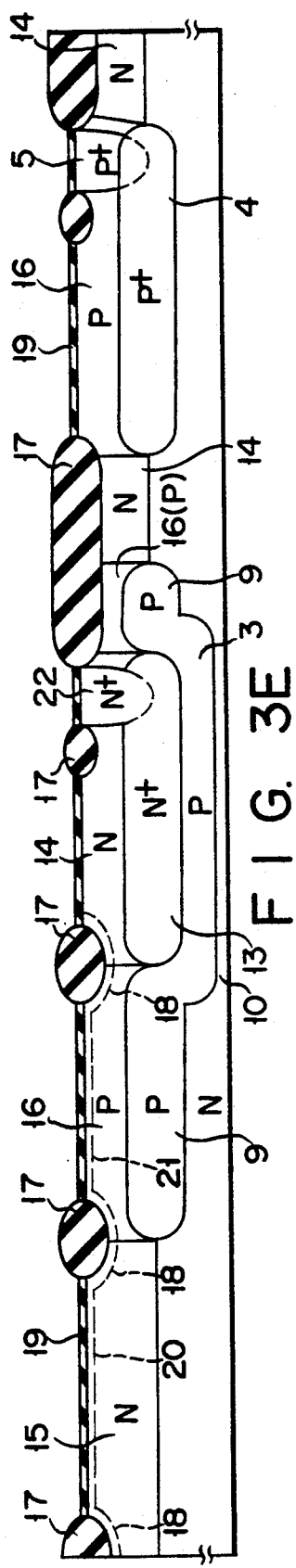

After this, as shown in FIG. 3E, a field oxide film 17, for isolating the MOS transistors from each other and from the bipolar transistors, is formed by selective oxidation. The thickness of the field oxide film 17 is approx. 6000 Å. An ion-implantation region 18 for field inversion prevention is formed in a self-alignment manner before formation of the field oxide film 17.

Further, phosphorus is ion-implanted into the N-type epitaxial layer 14 with an acceleration energy of 320 KeV and a dose amount of $1\times10^{16}$/cm$^2$ so as to form a deep N$^+$ ion-implanted region 22 in contact with the buried collector layer 13.

Likewise, ions are ion-implanted in the same manner with an acceleration energy of 160 KeV and a dose amount of $1\times10^{16}$/cm$^2$, so as to form a deep P$^+$ ion-implanted region 5 in contact with the collector region 4 of the PNP transistor. At this time, it is possible to enhance the impurity concentration of the buried collector region 4 by effecting the ion-implantation with an acceleration energy of 1 MeV and a dose amount of $5\times10^{14}$/cm$^2$ in order to form a higher performance PNP transistor.

Then, a dummy gate oxide film 19 with a film thickness of approx. 150 Å is formed on the entire surface by thermal oxidation. After this, a channel ion-implantation region 20, for controlling the threshold voltage of the P-channel MOS transistor and preventing the punchthrough thereof, is formed in the surface area of the N well regions 15 by ion-implantation through the dummy gate oxide film 19.

Further, a channel ion-implantation region 21, for controlling the threshold voltage of the N-channel MOS transistor and preventing the punchthrough thereof, is formed in the surface area of the P well region 16. In this case, the channel ion-implantation region 20 in the N well regions 15 is formed by ion-implanting boron (B) ions with an acceleration energy of 20 KeV and a dose amount of $3\times10^{12}$/cm$^2$, and ion-implanting phosphorus (P) ions with an acceleration energy of 240 KeV and a dose amount of $2\times10^{12}$/cm$^2$. Further, the channel ion-implantation region 21 in the P well region 16 is formed by ion-implanting boron (B) ions with an acceleration energy of 20 KeV and a dose amount of $4\times10^{12}$/cm$^2$.

Figure 3F:
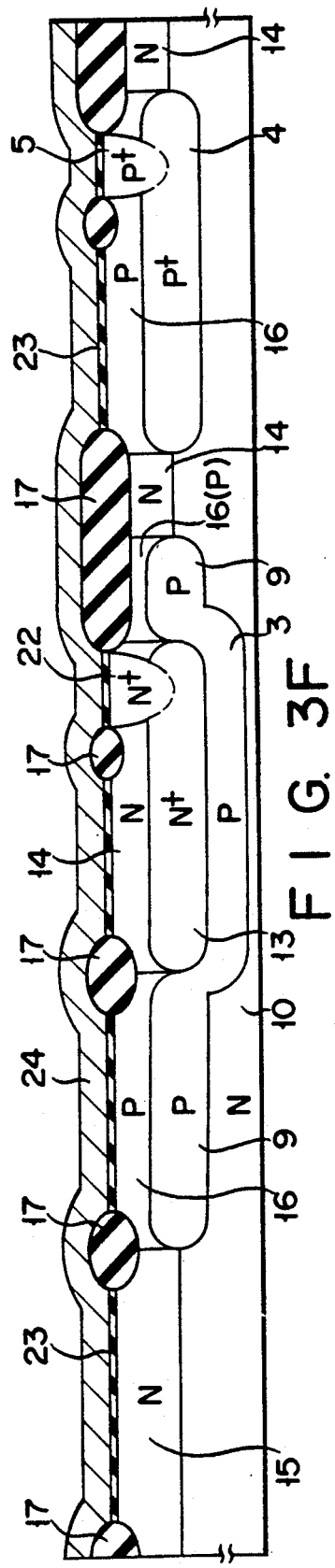

Next, as shown in FIG. 3F, an oxide film 23 with a thickness of approx. 150 Å is formed on the entire surface by thermal oxidation after the entire dummy gate oxide film 19 is removed. Then, a polysilicon layer 24 is formed on the gate oxide film 23 to a thickness of approx. 4000 Å by a chemical vapor deposition method (CVD method). After this, impurity is doped into the polysilicon layer 24 by phosphorus (P) diffusion to lower the resistance of the polysilicon layer 24.

Figure 3G:
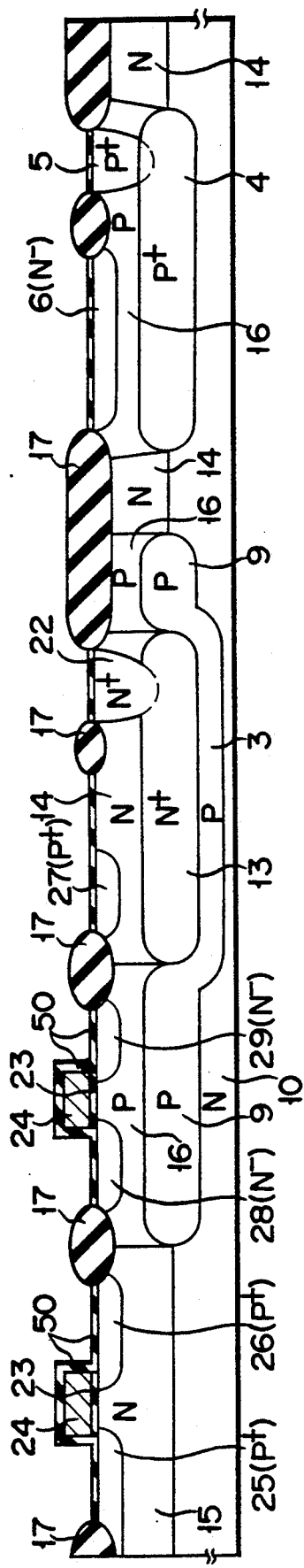

Next, as shown in FIG. 3G, the polysilicon layer 24 and the gate oxide film 23 are patterned by use of the photolithographic process to respectively form the gate electrodes of the P- and N-channel MOS transistors over the N well region 15 and P well region 16. After this, an oxidation process is effected for 30 minutes at a temperature of 900° C. in an atmosphere of $O_2$ to form an oxide film 50 which covers the gate electrodes. Then, a mask (not shown) formed by the photolithographic process, the field oxide film 17 and the gate electrodes are used as a mask to ion-implant $BF_2^+$ ions with an acceleration energy of 50 KeV and a dose amount of $5 \times 10^{15}/cm^2$ so as to form P+-type source and drain regions 25 and 26 in the surface area of the N well regions 15. At this time, the external base region 27 of the bipolar transistor is formed by ion-implanting an impurity into the N-type epitaxial layer 14 on the buried collector layer 13. After this, a mask (not shown) formed by a photolithographic process, the field oxide film 17, and the gate electrodes are used as masks to ion-implant P+ ions with an acceleration energy of 60 KeV and a dose amount of $4 \times 10^{13}/cm^2$ so as to form N−-type source and drain regions 28 and 29 in the surface area of the P well region 16.

In the step of ion-implanting the N− impurity, the internal base region 6 of the PNP transistor is formed. It is also possible to form the base region 6 in a different ion-implantation step.

Figure 3H:
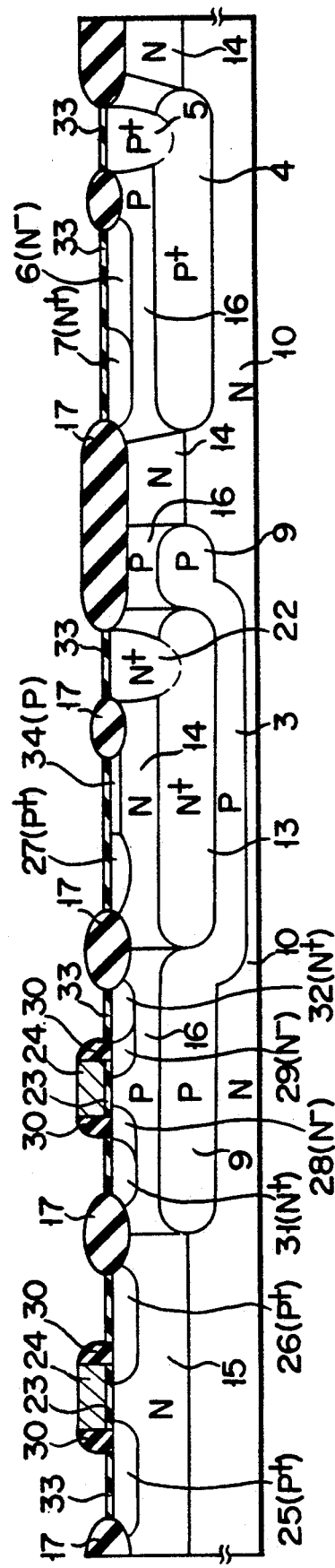

Next, as shown in FIG. 3H, a CVD-$SiO_2$ film 30 is formed to a thickness of 2000 Å on the entire surface of the resultant structure and is selectively etched by an anisotropic etching technique, such as a reactive ion etching process (RIE process), so that the CVD-$SiO_2$ film 30 can be left behind only on the side surfaces of the gate electrodes. Then, a mask (not shown) is formed with only the P well regions 16 exposed, and arsenic (As) ions are ion-implanted with an acceleration energy of 50 KeV and a dose amount of $5 \times 10^{15}/cm^2$ so as to form N+-type source and drain regions 31 and 32 in the surface area of the P well region 16. That is, an N-channel MOS transistor with a so-called lightly doped drain (LDD) structure is formed in the P well region 16.

In the step of ion-implanting the N+ impurity, the external base region 7 of the PNP transistor is formed.

After this, an oxidation process is effected for 30 minutes at a temperature of 900° C. in an $O_2$ atmosphere to form an oxide film 33 on the entire surface of the resultant structure. Further, after photoresist (not shown) is formed to cover the surface of the P well region 16 and N well region 15, $BF_2^+$ ions are ion-implanted with an acceleration energy of 30 KeV and a dose amount of $5 \times 10^{13}/cm^2$ so as to form a P+-type internal base region 34 in the N-type epitaxial layer 14 on the buried collector layer 13.

Figure 3I:
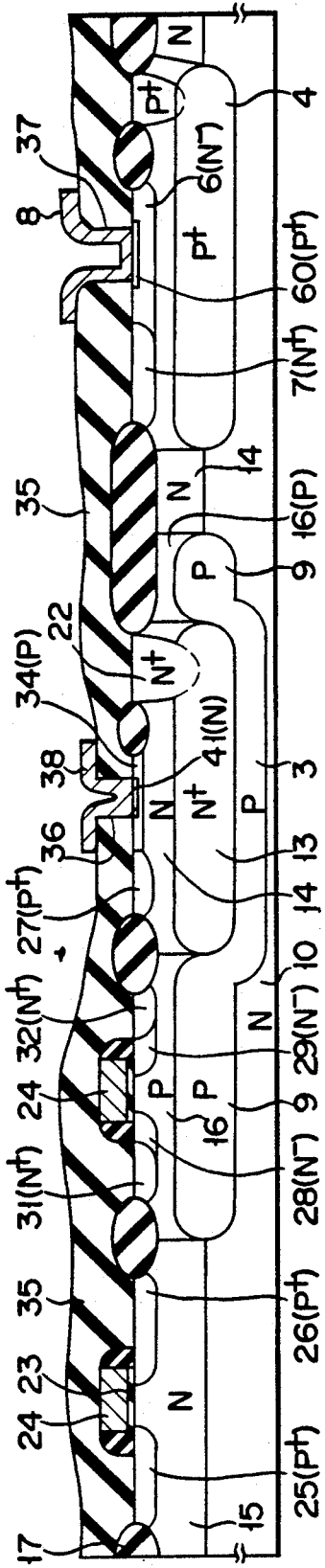

Next, as shown in FIG. 3I, a CVD-$SiO_2$ film 35 is formed as an interlayer insulation film to a thickness of 2000 Å on the entire surface of the resultant structure and a contact hole 36, which exposes part of the surface of the internal base region 34 of the NPN transistor, and a contact hole 37, which exposes part of the surface of the N−-type internal base region 6 of the PNP transistor, are formed in the CVD-$SiO_2$ film 35. After this, a polysilicon layer is deposited to a thickness of 2000 Å and then patterned to form polysilicon layers 38 and 8 which will be used as the emitter electrodes of the NPN and PNP transistors. At this time, it is preferable to set the deposition temperature of the polysilicon below 600° C. After this, As ions are ion-implanted into the polysilicon layer 38 with an acceleration energy of 50 KeV and a dose amount of $5 \times 10^{15}/cm^2$ so as to form an N-type emitter region 41 in the surface area of the internal base region 34. At this time, $BF_2$ ions are selectively ion-implanted into the polysilicon layer 8 in the same manner as described above with a dose amount of $5 \times 10^{15}/cm^2$ so as to form a P-type emitter region 60 in the internal base region 6.

After the ion-implantation process, heat treatment is effected for 5 seconds to 1 minute at temperatures of 950° to 1100° C. to effect a so-called rapid annealing process. As a result, good contact can be attained.

Figure 3J:
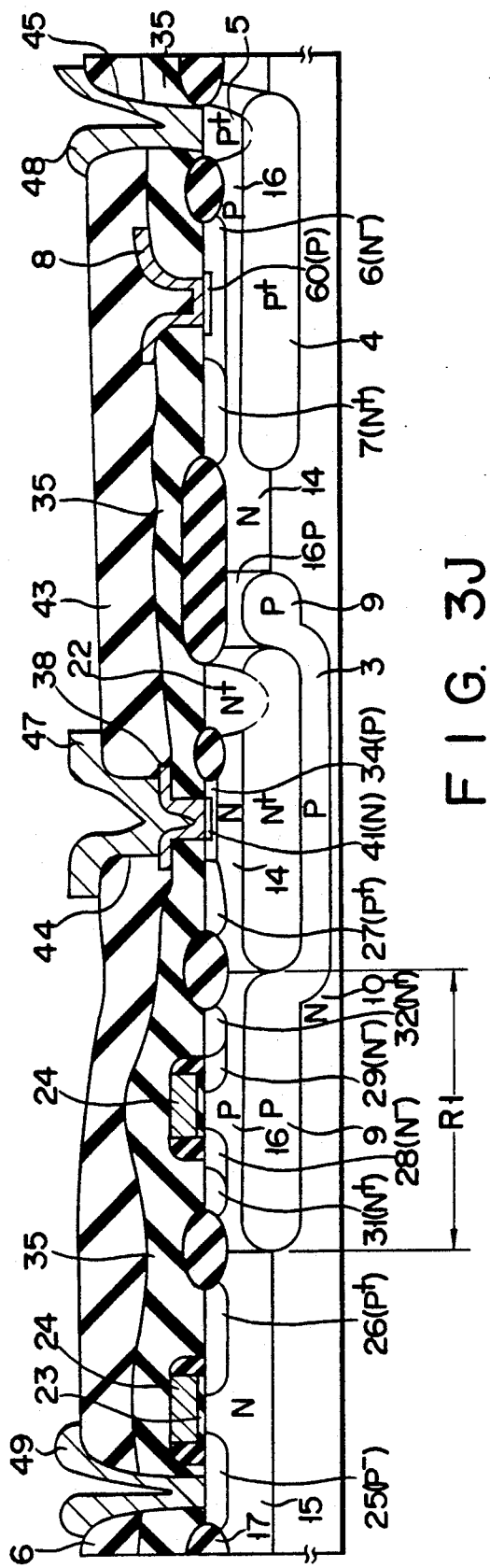

Next, as shown in FIG. 3J, an interlayer insulation film 43 formed of a CVD-$SiO_2$ film and a BPSG film is deposited on the entire surface of the resultant structure for surface planarization, then a contact hole 44, which exposes that part of the surface of the polysilicon layer 38 serving as the emitter electrode, is formed in the interlayer insulation film 43, and at the same time, a contact hole 45, which exposes part of the surface of the deep P+ layer 5 of the PNP transistor, and a contact hole 46, which exposes part of the surface of the source region 25 of the P-channel MOS transistor, are formed in the interlayer insulation film 43 and the underlying CVD-$SiO_2$ film 35. After this, a wiring aluminum layer is deposited on the entire surface of the resultant structure by a vacuum deposition process and is patterned to form aluminum wirings 47, 48 and 49. Thus the semiconductor device is completed.

In the structure of the third embodiment, since the N-channel MOS transistor constituting the memory cell is formed in the P well 16 formed in the N-type substrate 10, a specified substrate bias voltage which is different from that applied to the substrate 10 can be applied to the P well 16. Further, the N well 14 of the NPN transistor is surrounded by the P wells 3, 9 and 16 and is thus electrically isolated from the N-type substrate 10. Therefore, a specified bias voltage which is different from that applied to the N-type substrate 10 can be applied to the N well 14 of the NPN transistor.

Figure 3K:
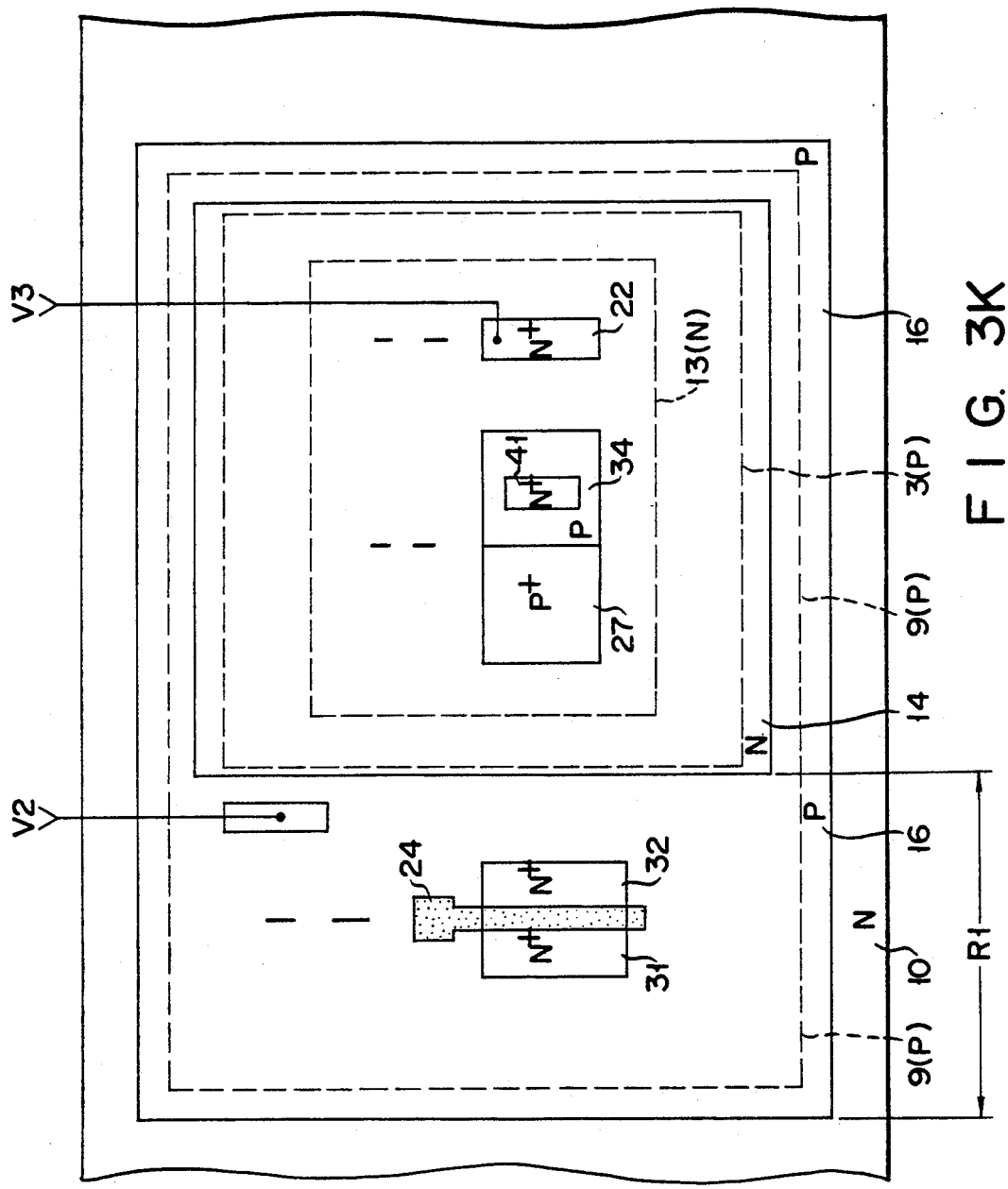
FIG. 3K is a view showing the plane pattern of the Bi-CMOS semiconductor device according to the third embodiment of this invention.

FIG. 3K schematically shows the plane pattern of the main portion of the Bi-CMOS semiconductor device of the third embodiment. In the semiconductor device of FIG. 3K, a specified bias voltage V2, which is different from the bias voltage applied to the substrate 10, is applied to the P well 16 of the N-channel MOS transistor formed in the area R1. Further, a specified bias voltage V3, which is different from the bias voltage applied to the substrate 10, is applied to the N well 14 of the NPN transistor. In this way, with the structure of the third embodiment using the N-type substrate 10, it is possible to apply specified bias voltages to the N-channel MOS transistor constituting the memory cell and the NPN transistor.

In the third embodiment, the emitter electrode of the PNP transistor is formed by impurity diffusion from the P-type polysilicon layer, but it is possible to form the emitter electrode by ion-implantation.

As described above, according to this invention, the well of the MOS transistor used as the memory cell is electrically isolated from the well of the other transistor and the substrate. As a result, the soft error rate which is more than 10000 FIT in the conventional Bi-CMOS hybrid memory LSI can be suppressed to below 10 FIT.

Further, since different substrate bias voltages can be applied to the N-channel MOS transistor of the memory cell section and the N-channel MOS transistor of the peripheral circuit section, the access time of the memory device can be shortened by 2 nsec.

This can be attained for the following reason. In order to enhance the operation speed of the memory device, it is required in the peripheral circuit section to satisfy the two conditions that (1) the threshold voltage Vth of the N-channel MOS transistor should be lowered and (2) the parasitic capacitance of the N-channel MOS transistor should be reduced. On the other hand, in the memory cell section, and particularly in the memory cell of an SRAM, it is necessary to use an N-channel MOS transistor having a relatively high threshold voltage Vth in order to hold data in sufficiently good condition as described before. In this invention, the threshold voltage of the N-channel MOS transistor used as the memory cell is raised by applying a high substrate bias voltage to the N-channel MOS transistor, and further a low substrate bias voltage is applied to the N-channel MOS transistor, which is not used as the memory cell, so as to satisfy the above conditions (1) and (2). As a result, the operation speed of the memory device can be enhanced without degrading the reliability of the data holding property of the memory device.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A Bi-CMOS semiconductor device comprising:
    a semiconductor body;
    a buried layer of a first conductivity type formed in said semiconductor body;
    well regions formed in said semiconductor body, a first well region of said well regions comprising a well region of a second conductivity type formed on said buried layer;
    a first MOS transistor of the first conductivity channel type formed in said first well region of the second conductivity type; and
    isolating regions of the first conductivity type formed such that said isolating regions and said buried layer electrically isolate the first well region from said semiconductor body and from other well regions formed in said semiconductor body.

2. A Bi-CMOS semiconductor device according to claim 1, further comprising a second MOS transistor of the first conductivity channel type formed in a second well region of said well regions, the second well region being electrically isolated from the first well region by said isolating regions and said buried layer.

3. A Bi-CMOS semiconductor device according to claim 2, wherein first and second bias voltages, which are different from each other, are applied to the first and second well regions.

4. A Bi-CMOS semiconductor device according to claim 3, wherein the semiconductor device is a memory device, said first MOS transistor forming part of a memory cell of said memory device, and said second MOS transistor forming part of a peripheral circuit of said memory device.

5. The Bi-CMOS semiconductor device according to claim 1 wherein said first MOS transistor comprises an N-channel MOS transistor.

6. The Bi-CMOS semiconductor device according to claim 5 wherein said N-channel MOS transistor forms part of a memory cell.

7. A Bi-CMOS semiconductor device comprising:
    a semiconductor body;
    a buried layer of a first conductivity type formed in said semiconductor substrate;
    well regions formed in said semiconductor body, a first well region of said well regions comprising a well region of the first conductivity type formed on said buried layer;
    a first MOS transistor of a second conductivity channel type formed in said first well region of the first conductivity type; and
    an isolating region of the second conductivity type formed such that said isolating region electrically isolates said first well region and said buried layer from said semiconductor body and from other well regions formed in said semiconductor body.

8. A Bi-CMOS semiconductor device according to claim 7, further comprising a second MOS transistor of the second conductivity channel type formed in a second well region of said well regions, the second well region being of the first conductivity type and being electrically isolated from the first well region and from said buried layer by said isolating region.

9. A Bi-CMOS semiconductor device according to claim 8, wherein first and second bias voltages, which are different from each other, are applied to the first and second well regions.

10. A Bi-CMOS semiconductor device according to claim 9, wherein the semiconductor device is a memory device, said first MOS transistor forming part of a memory cell of said memory device, and said second MOS transistor forming part of a peripheral circuit of said memory device.

11. The Bi-CMOS semiconductor device according to claim 7 wherein said first MOS transistor comprises an N-channel MOS transistor.

12. The Bi-CMOS semiconductor device according to claim 11 wherein said N-channel MOS transistor forms part of a memory cell.

13. A Bi-CMOS semiconductor device comprising:
    a semiconductor body;
    a buried layer of a first conductivity type formed in said semiconductor body;
    an isolating region of a second conductivity type formed in said semiconductor body such that said isolating region electrically isolates said buried layer from said semiconductor body;
    a first well region of the first conductivity type formed on said buried layer;
    a second well region of the second conductivity type formed adjacent to said first well region;
    a bipolar transistor formed in said first well region; and
    a first MOS transistor of the first conductivity channel type formed in said second well region.

14. The Bi-CMOS semiconductor device according to claim 13, wherein said second well region and said isolating region electrically isolate said first well region from said semiconductor body.

15. A Bi-CMOS semiconductor device according to claim 13, wherein the semiconductor device is a memory device, said first MOS transistor forming part of a memory cell of said memory device, and said bipolar transistor forming part of a peripheral circuit of said memory device.

16. The Bi-CMOS semiconductor device according to claim 13 wherein said first MOS transistor comprises an N-channel MOS transistor.

17. The Bi-CMOS semiconductor device according to claim 16 wherein said N-channel MOS transistor forms part of a memory cell.

18. The Bi-CMOS semiconductor device according to claim 17 wherein said first and second MOS transistors comprise N-channel MOS transistors.

19. The Bi-CMOS semiconductor device according to claim 18 wherein said first N-channel MOS transistor forms part of a memory cell.

20. A Bi-CMOS semiconductor memory device comprising:
   a semiconductor substrate of a first conductivity type;
   a buried layer of a second conductivity type formed in said semiconductor substrate;
   an epitaxial layer of a second conductivity type formed on said semiconductor substrate;
   well regions formed in said epitaxial layer, a first well region of said well regions comprising a well region of the first conductivity type formed on said buried layer;
   a first MOS transistor of the second conductivity channel type formed in said first well region of the first conductivity type;
   isolating regions of the second conductivity type formed such that said isolating regions and said buried layer electrically isolate the first well region from said semiconductor substrate and from other well regions;
   a second MOS transistor of the second conductivity channel type formed in a second well region of said well regions, the second well region being of the first conductivity type and being electrically isolated from the first well region by said isolating region and said buried layer; and
   means for applying respective first and second different bias voltages to said first and second well regions.

21. The Bi-CMOS semiconductor device according to claim 20 wherein said first and second MOS transistors comprise an N-channel MOS transistor.

22. The Bi-CMOS semiconductor device according to claim 21 wherein said first N-channel MOS transistor forms part of a memory cell.

23. A Bi-CMOS semiconductor memory device comprising:
   a semiconductor substrate of a first conductivity type;
   a buried layer of the first conductivity type formed in said semiconductor substrate;
   an epitaxial layer of the second conductivity formed on said semiconductor substrate;
   well regions formed in said epitaxial layer, a first well region of said well regions comprising a well region of the first conductivity type formed on said buried layer;
   a first MOS transistor a second conductivity channel type formed in the first well region of the first conductivity type;
   an isolating region of the second conductivity type formed such that said isolating region electrically isolates said buried layer and the first well region from said semiconductor substrate and other well regions;
   a second MOS transistor of the second conductivity channel type formed in a second well region of said well regions, the second well region being of the first conductivity type and being electrically isolated from the first well region and said buried layer by said isolating region; and
   means for applying respective first and second different bias voltages to said first and second well regions.

* * * * *